US008324612B2

(12) United States Patent
Lee et al.

(10) Patent No.: US 8,324,612 B2
(45) Date of Patent: Dec. 4, 2012

(54) THIN FILM TRANSISTOR, METHOD OF FABRICATING THE SAME, AND FLAT PANEL DISPLAY HAVING THE SAME

(75) Inventors: Hun-Jung Lee, Suwon-si (KR); Jae-Bon Koo, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1630 days.

(21) Appl. No.: 11/151,276

(22) Filed: Jun. 14, 2005

(65) Prior Publication Data
US 2005/0279999 A1    Dec. 22, 2005

(30) Foreign Application Priority Data

Jun. 17, 2004   (KR) ................... 10-2004-0045027

(51) Int. Cl.
*H01L 35/24* (2006.01)
(52) U.S. Cl. ............. 257/40; 257/66; 257/41; 257/59; 257/72
(58) Field of Classification Search .......... 257/40, 257/66, 59, 72
See application file for complete search history.

(56) References Cited

U.S. PATENT DOCUMENTS

| 6,569,707 B2 * | 5/2003 | Dimitrakopoulos et al. ... 438/99 |
| 6,992,324 B2 * | 1/2006 | Nagayama ..................... 257/40 |
| 2003/0075715 A1 | 4/2003 | Satoh et al. |
| 2005/0023893 A1 | 2/2005 | Sanada |

FOREIGN PATENT DOCUMENTS

| CN | 1476111 | 2/2004 |
| DE | 10 2004 036820 | 3/2003 |
| JP | 2003-092410 | 3/2003 |
| JP | 2004055652 | 2/2004 |
| JP | 2005-047427 | 2/2005 |
| KR | 2004065870 | 7/2004 |

OTHER PUBLICATIONS

Chinese Office Action dated Jun. 6, 2008.

* cited by examiner

*Primary Examiner* — Samuel Gebremariam
(74) *Attorney, Agent, or Firm* — H.C. Park & Associates, PLC

(57) ABSTRACT

A thin film transistor (TFT), a method of fabricating the TFT, and a flat panel display having the TFT, wherein the TFT includes a substrate; a gate electrode provided on the substrate; a gate insulating layer provided on the gate electrode; a source electrode and a drain electrode provided on the gate insulating layer and insulated from the gate electrode; and an organic semiconductor layer contacting the source and drain electrodes and insulated from the gate electrode.

6 Claims, 5 Drawing Sheets

THIN FILM TRANSISTOR, METHOD OF FABRICATING THE SAME, AND FLAT PANEL DISPLAY HAVING THE SAME

This application claims the priority of Korean Patent Application No. 10-2004-0045027, filed on Jun. 17, 2004, in the Korean Intellectual Property Office, which is hereby incorporated by reference for all purposes as if fully set forth herein.

BACKGROUND OF THE INVENTION

1. Field of the Invention

The present invention relates to a thin film transistor and a flat panel display having the same, and more particularly, to the structure of a thin film transistor enabling smooth electrical communication between source and drain electrodes, and a flat panel display having the same.

2. Discussion of the Background

A thin film transistor (TFT) included in flat panel displays (FPDs), such as liquid crystal displays (LCDs), and organic or inorganic electro-luminescence (EL) displays, is used as a switching device for controlling the operation of each pixel and/or a driving device for driving each pixel.

A conventional TFT includes a semiconductor layer, a gate electrode, and source and drain electrodes. The semiconductor layer includes source and drain regions doped with impurities and a channel region provided between the source and drain regions. The gate electrode is electrically insulated from the semiconductor layer and provided in a position corresponding to the channel region. The source and drain electrodes are in contact with the source and drain regions, respectively.

TFTs have recently been adapted for use in various other technologies, such as smart cards, e-papers, and roll-up displays, which require highly flexible thin-film electronic devices. As a result, the TFTs should include a highly flexible substrate, such as a plastic substrate.

However, a conventional formation of an inorganic semiconductor layer involving a high-temperature process performed at 300° C. or higher cannot employ a plastic substrate since such material is intolerant of heat.

Research for a polysilicon fabricating process that satisfies design specification and enables low-temperature processes is currently being conducted, however such research has thus far failed to realize the anticipated result.

Therefore, to solve this problem, much attention is now focused on organic semiconductors since an organic semiconductor layer may be formed at a sufficiently low temperature.

Japanese Patent Laid-open Publication No. 2003-282883 discloses a bottom-contact type organic semiconductor transistor, in which an organic semiconductor layer is formed on a surface of a gate insulating layer covering a gate electrode, and source and drain electrodes are formed on a surface of the organic semiconductor layer.

Also, in Japanese Patent Laid-open Publication No. 2003-092410, a top contact type organic TFT is provided with a gate electrode, which is located in a position corresponding to a channel region, and the channel region, is formed of organic compounds having radicals.

In the conventional organic TFTs discussed above, source and drain electrodes are typically formed of noble metals, such as Au, to enable smooth electrical communication between the source and drain electrodes and an organic semiconductor layer. In this case, the noble metals forming the source and drain electrodes greatly deteriorate adhesion to stack layers disposed thereunder, particularly, an insulating layer formed of $SiN_x$ or $SiO_2$.

To improve adhesion between a Pt electrode and an $SiO_2$ insulating layer disposed thereunder, Korean Patent Laid-open Publication No. 2003-3067 proposes an organic TFT that further includes an adhesion improving layer formed of Ti.

FIG. 1A is a cross-sectional view of a conventional organic TFT including an adhesion improving layer. Referring to FIG. 1A, a gate electrode 12 is formed on a surface of a substrate 11, and a gate insulating layer 13 is formed thereon to cover the gate electrode 12. A source electrode 15a and a drain electrode 15b are formed on a surface of the gate insulating layer 13, and an organic semiconductor layer 16 is formed thereon. Between the source and drain electrodes 15a and 15b and the gate insulating layer 13, an adhesion improving layer 14 formed of Ti is disposed.

The organic TFT operates by applying electric signals to the gate electrode 12 and the source and drain electrodes 15a and 15b. An example of the operating method of the organic TFT is illustrated in FIG. 1B, which is a partial exploded view of a portion "A" shown in FIG. 1A.

Referring to FIG. 1B, when the organic semiconductor layer 16, an active layer, is a p-type semiconductor, a negative voltage is applied to the gate electrode 12, and a predetermined voltage is applied to the source and drain electrodes 15a and 15b, charge carriers accumulate in a lower portion of the organic semiconductor layer 16, which contacts the gate insulating layer 13, thereby forming an accumulation layer 16a. However, a work function difference between Ti forming the adhesion improving layer 14 and the organic semiconductor layer 16 prevents efficient electrical communication or significantly reduces the efficiency of such communication. Accordingly, when the accumulation layer 16a is formed in a portion or region of the organic semiconductor layer 16 that is adjacent to the gate insulating layer 13, an electric signal input from the source electrode 15a may not be transmitted through a channel region of the organic semiconductor layer 16 to the drain electrode 15b.

Thus, when a TFT is used to select a pixel of an FPD or drive the pixel, a desired pixel may not be selected or an electric signal may not be applied to a selected pixel. As a result, the screen quality of the FPD may be adversely affected.

SUMMARY OF THE INVENTION

The present invention provides a thin film transistor (TFT), which makes electrical communication between source and drain electrodes efficient, a method of fabricating the TFT, and a flat panel display (FPD) having the TFT. According to an embodiment of the invention, there is provided a thin film transistor including a substrate, a gate electrode provided on the substrate, a gate insulating layer provided on the gate electrode, a source electrode and a drain electrode provided on the gate insulating layer and insulated from the gate electrode, and an organic semiconductor layer contacting the source electrode and the drain electrode and insulated from the gate electrode, wherein oxidation portions are provided in portions of the source electrode and the drain electrode that make contact with the organic semiconductor layer.

According to another embodiment of the invention, there is provided a method of fabricating a thin film transistor, including forming a gate electrode on a substrate, forming a gate insulating layer on the gate electrode, forming a source electrode and a drain electrode on a surface of the gate insulating layer, oxidizing the source electrode and the drain electrode, forming an organic semiconductor layer to contact the source electrode and the drain electrode.

According to another embodiment of the invention, there is provided a flat panel display including a thin film transistor layer and a pixel layer having at least one pixel and formed in a display region of a substrate, wherein the thin film transistor layer includes a gate electrode provided on the substrate, a gate insulating layer provided on the gate electrode, a source electrode and a drain electrode provided on the gate insulating layer and insulated from the gate electrode, and an organic semiconductor layer contacting the source electrode and the drain electrode and insulated from the gate electrode, wherein oxidation portions are provided in portions of the source and drain electrodes that make contact with the organic semiconductor layer, and wherein the oxidation portions are formed of a material having a work function that is greater than a HOMO energy level of the organic semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

FIG. 2A, FIG. 2B, FIG. 2C, FIG. 2D, FIG. 2E and FIG. 2F are cross-sectional views illustrating a process of fabricating a TFT according to an embodiment of the invention.

Figure 1A:
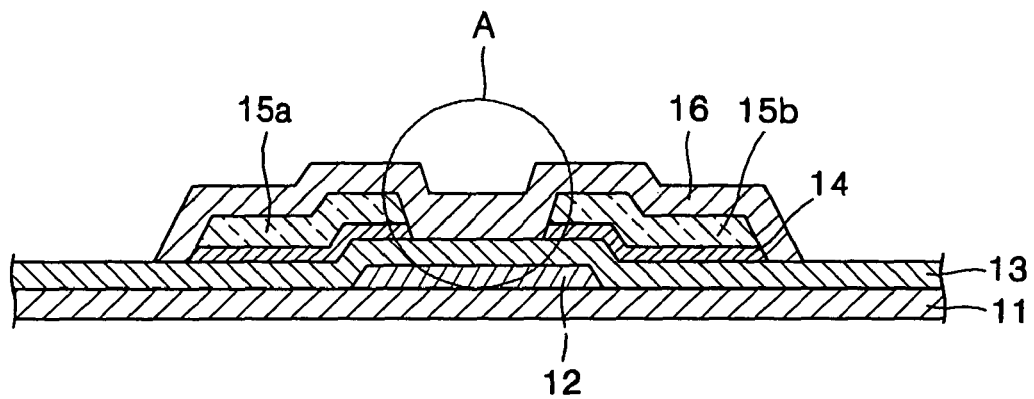
FIG. 1A is a cross-sectional view of a conventional organic thin film transistor (TFT).
Figure 1B:
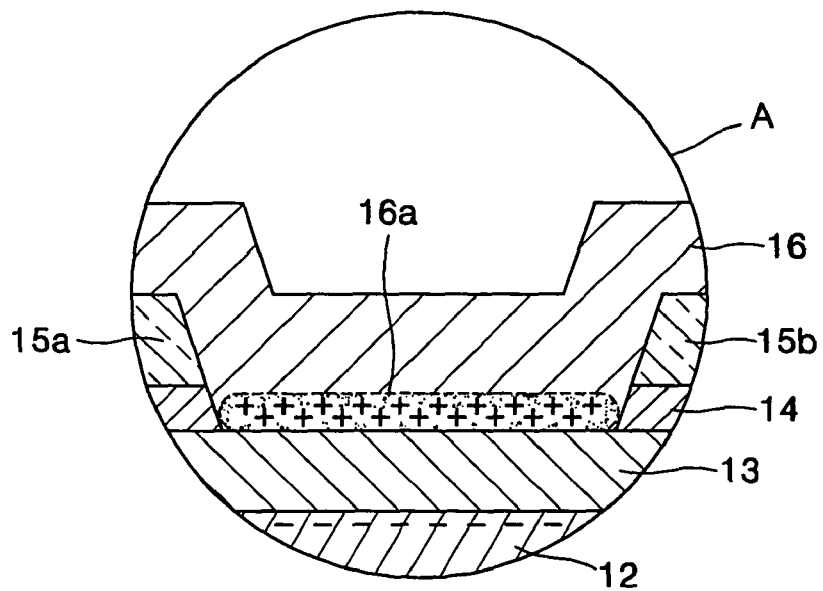
FIG. 1B is a cross-sectional view illustrating the operating state of a portion "A" shown in FIG. 1A.
Figure 2A:
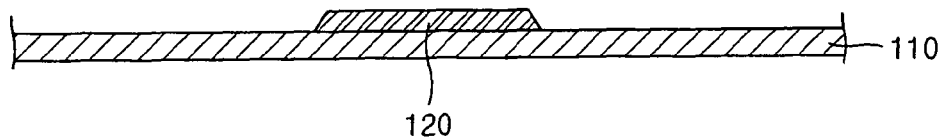
FIG. 2A, FIG. 2B, FIG. 2C, FIG. 2D, FIG. 2E and FIG. 2F are cross-sectional views illustrating a process of fabricating a TFT according to an embodiment of the invention.
Figure 2B:
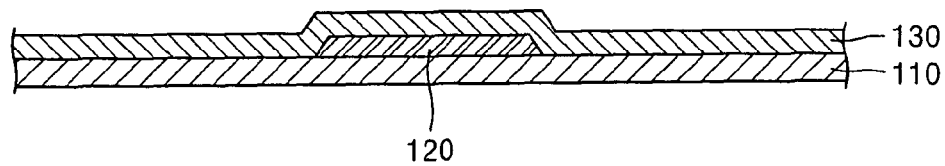

Referring to FIGS. 2A and 2B, a gate electrode 120 is formed on a surface of a substrate 110, and a gate insulating layer 130 is formed on the substrate 110, including the gate electrode 120 to electrically insulate the gate electrode 120 from source and drain electrodes (140a and 140b of FIG. 2D), which will be formed later. The substrate 110 may be made of a glass material or a plastic material such as polyethylene terephthalate (PET), polyethylene naphthalate (PEN), polyether sulfone (PES), polyether imide, polyphenylene sulfide (PPS), polyallylate, polyimide, polycarbonate (PC), cellulose triacetate (TAC), cellulose acetate propinonate (CAP), and the like.

Selectively, a buffer layer (not shown) may be provided between the gate electrode 120 and the substrate 110. The gate electrode 120 may be made of a conductive metal, such as MoW, Al, Cr, Al/Cr, and the like, or a conductive polymer, such as conductive polyaniline, conductive poly pirrole, conductive polythiopjene, polyethylene dioxythiophene (PEDOT), polystyrene sulfonic acid (PSS), and the like. Several factors should be considered when forming the gate electrode 120, such as forming the gate electrode 120 of an appropriate material considering a close adhesion to adjacent layers, flatness of layers stacked thereon, processing, and tolerance to chemical materials used during subsequent processes.

As shown in FIG. 2B, the gate insulating layer 130 is used to electrically insulate the gate electrode 120 from the subsequently formed source and drain electrodes 140a and 140b of FIG. 2D. The gate insulating layer 130 may be deposited using a chemical vapor deposition (CVD) technique or a sputtering technique and an inorganic insulating material, such as $SiO_2$, $SiN_x$, $Al_2O_3$, $Ta_2O_5$, BST, PZT, and the like, or an ordinary polymer, such as PMMA(poly methylmethacrylate), PS(polystyrene), phenolic polymers, acrylic polymers, imidic polymers such as polyimide, aryl ether polymers, amidic polymers, fluoric polymers, p-xylilen polymers, vinyl alcoholic polymers, parylene, any combination of the above listed polymers, or the like. The gate insulating layer 130 may be formed of multiple layers or have various structures. The gate insulating layer 130 is preferably formed of a material having a good insulating characteristic, a high dielectric constant, and a thermal expansion rate equal or similar to that of the substrate 110.

Figure 2C:
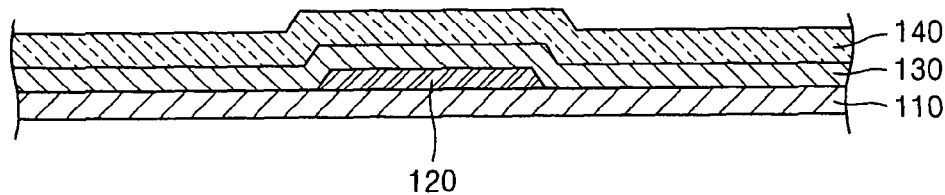
Figure 2D:
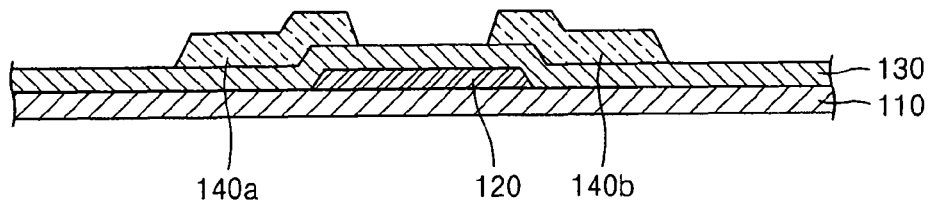

After forming the gate insulating layer 130, as shown in FIG. 2C, a source and drain electrode layer 140 is formed on one surface of the gate insulating layer 130 and patterned using an appropriate pattern formation process, such as photoetching or photolithography, thereby forming the source and drain electrodes 140a and 140b, as shown in FIG. 2D.

Figure 2E:
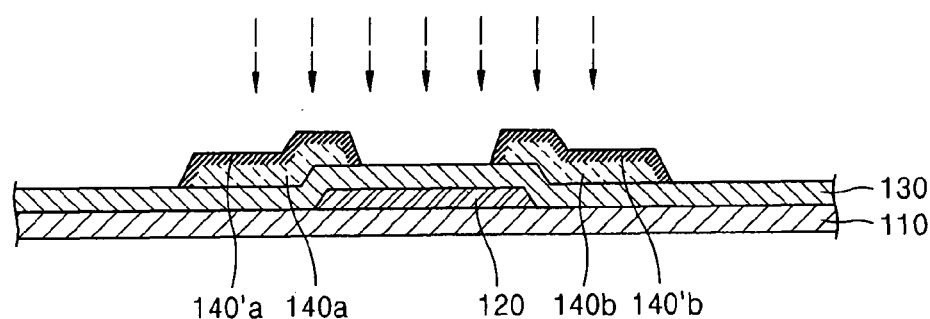

Referring to FIG. 2E, portions of the source and drain electrodes 140a and 140b that will make contact with an organic semiconductor layer (150 of FIG. 2F), which will be is formed in a later operation, are oxidized to form oxidation portions 140'a and 140'b. Such an oxidation process can be performed using various methods.

For example, the source and drain electrodes 140a and 140b may be oxidized using thermal oxidation or $O_3$ oxidation. In the thermal oxidation, the exposed surfaces of the source and drain electrodes 140a and 140b are annealed or hardened in a furnace for a predetermined amount of time in an $O_2$ atmosphere. In the $O_3$ oxidation, portions of the source and drain electrodes 140a and 140b to be oxidized are cleaned using $O_3$, thereby forming the oxidation portions 140'a and 140'b. Thus, a method of oxidizing the source and drain electrodes 140a and 140b can be appropriately selected according to the design specification of the TFT, such as the materials that make up the layers stacked or provided thereunder.

In the above described embodiment, although the patterning of the source and drain electrodes 140a and 140b occurs before the oxidation thereof, the invention is not limited thereto. Instead, the source and drain electrodes 140a and 140b may be patterned and oxidized at the same time. For example, when the source and drain electrodes 140a and 140b are formed using a dry etching technique, such as plasma etching, the source and drain electrodes 140a and 140b may be etched and implanted with $O_2$ simultaneously by creating an $O_2$ atmosphere around portions to be etched.

Figure 2F:
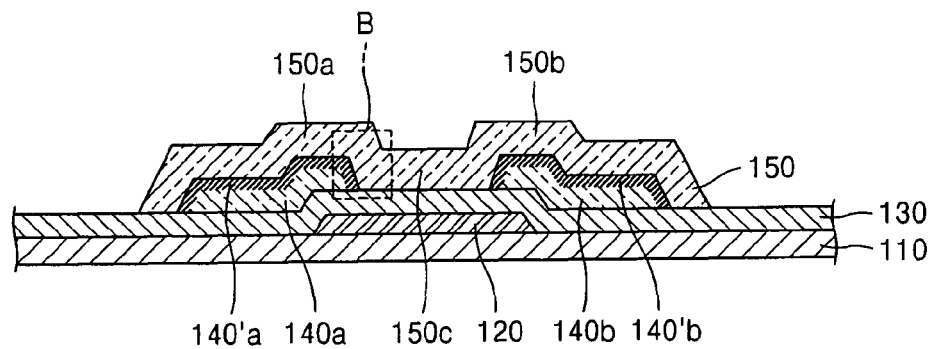

After the forming of the oxidation portions 140'a and 140'b in the source and drain electrodes 140a and 140b, respectively, as shown in FIG. 2F, the organic semiconductor layer 150 is formed over the source and drain electrodes 140a and 140b. This organic semiconductor layer 150 includes a source region 150a and a drain region 150b, which correspond to the source and drain electrodes 140a and 140b, respectively, and a channel region 150c.

The organic semiconductor layer 150 may be made of at least one of pentacene, tetracene, anthracene, naphthalene, alpha-6-thiophene, and any of the following polymers or their derivatives: perylene, rubrene, coronene, perylene tetracarboxylic diimide, perylene tetracarboxylic dianhydride, polythiophene, polyparaphenylenvinylene, polyparaphenylen, polyflorene, polythiophenevinylene, polythiophene-heterocyclic aromatic copolymer, oligoacene of naphthalene, oligothiophene of alpha-5-thiophene, metal-containing or metal-free phthalocyanin, pyromelitic dianhydride, pyromelitic diimide, perylenetetracarboxylic acid dianhydride, perylenetetracarboxylic diimide, naphthalene tetracarboxylic acid diimide, and naphthalene tetracarboxylic acid dianhydride.

Several factors should be considered regarding the source and drain Electrodes 140a and 140b and the oxidation portions 140'a and 140'b. According to an embodiment of the invention, the source and drain electrodes 140a and 140b should be reliably or strongly adhered to or connected with the gate insulating layer 130 disposed thereunder and smoothly electrically communicate with the organic semiconductor layer 150. In particular, holes, which operate as charge carriers, should be efficiently injected from the oxidation portion 140'a formed on the surface of the source electrode 140a into the organic semiconductor layer 150. To meet the above-described considerations, the source and drain electrodes 140a and 140b may be made of Al, Mo, MoW, or the like.

Figure 3:
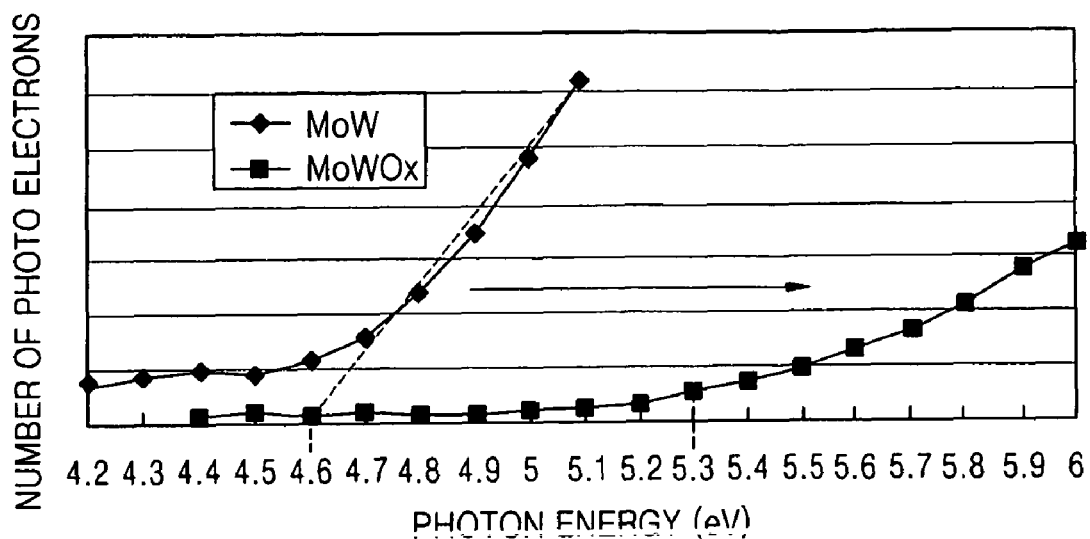
FIG. 3 is a graph of work functions with respect to samples measured before and after oxidation.

FIG. 3 is a graph of work functions with respect to different metal materials used to form the source and drain electrodes 140a and 140b. The materials are MoW, which is an example of a material used to form the source and drain electrodes 140a and 140b, and $MoWO_x$, which is an oxide of MoW. Referring to FIG. 3, the horizontal axis refers to photon energy that is applied to each of MoW and $MoWO_x$, and the vertical axis refers to the number of photo electrons extracted from each of MoW and $MoWO_x$, to which the photon energy is applied. A point of inflection in each line refers to a photon energy applied to the surface of each material when photo electrons are first extracted from the materials, e.g., a work function of each material.

For example, as shown in FIG. 3, the number of photo electrons extracted from the surface of MoW begins to notably increase at a photon energy of 4.6 eV, while the number of photo electrons extracted from the surface of $MoWO_x$ does not begin to notably increase until it reaches a photon energy of 5.3 eV. Thus, 4.6 eV and 5.3 eV are the approximate work functions of MoW and $MoWO_x$, respectively. Therefore, since the work function of $MoWO_x$, e.g., an oxide of MoW, is much greater than that of MoW, the oxidation portions 140'a and 140'b may be formed of a material having a larger work function than an energy level of the highest occupied molecular orbital (HOMO), e.g., valence band, of the organic semiconductor layer 150, which reduces interface banners and improves electrical contact between the source and drain electrodes 140a and 140b. Therefore, the source and drain electrodes 140a and 140b and the oxidation portions 140'a and 140'b can meet the above-described requirements since they are formed of materials having a sufficiently high work function.

Figure 4:
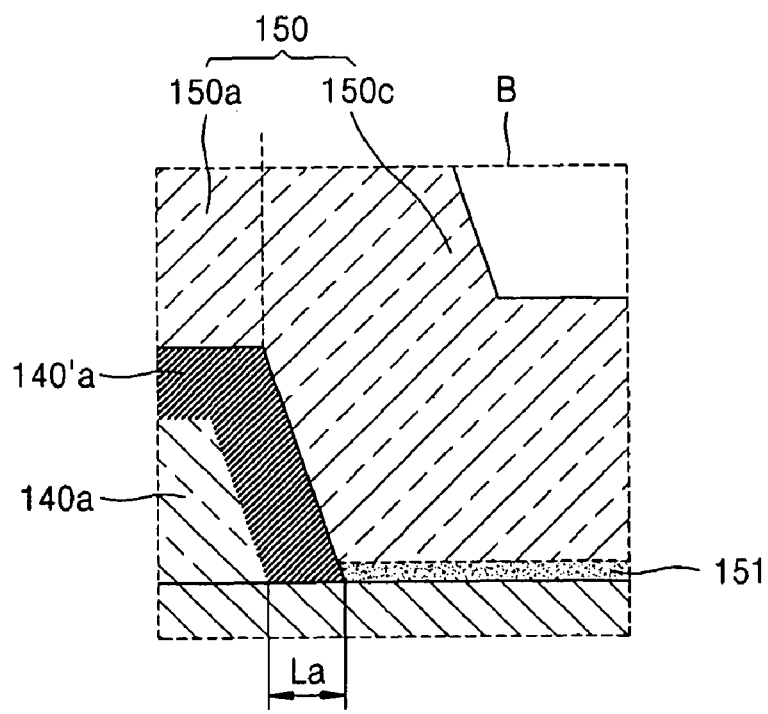
FIG. 4 is a partial exploded view of a portion "B" shown in FIG. 2F.

FIG. 4 is a partial exploded view of a portion "B" shown in FIG. 2F. Referring to FIG. 2F and FIG. 4, by applying an appropriate voltage to the gate electrode 120, charge carriers accumulate or collect in a portion of the organic semiconductor layer 150 that contacts the gate insulating layer 130 and form an accumulation layer 151. An electric signal applied via the source electrode 140a is transmitted through the oxidation portion 140'a having a sufficient oxidative concentration and/or thickness La and an accumulation layer 151 of the channel region 150c of the organic semiconductor layer 150 to the drain electrode 140b (not shown in FIG. 4), thereby enabling electrical communication between the source and drain electrodes 140a and 140b.

However, if the oxidation portions 140'a and 140'b are formed too thick and/or too heavily concentrated by excessively oxidizing the source and drain electrodes 140a and 140b, then the injection of charge carriers into the accumulation layer 151 of the channel region 150c of the organic semiconductor layer 150 may be obstructed. Therefore, the oxidation process should be controlled to form oxidation portions 140'a and 140'b having an appropriate concentration and thickness.

According to another embodiment, the TFT having the above-described and shown structure may be adapted for use in a flat panel display (FPD), such as a liquid crystal display (LCD), an organic electro-luminescence (EL) display, or the like.

Figure 5:
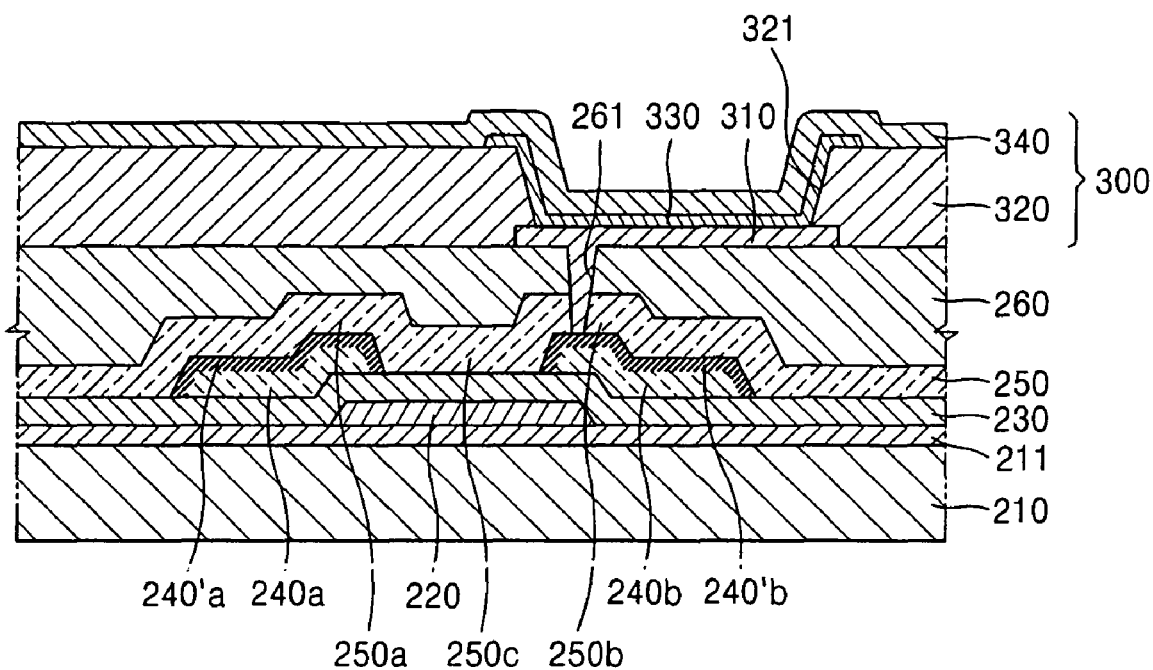
FIG. 5 is a partial cross-sectional view of an organic electro-luminescence display device including a TFT according to another embodiment of the invention.

FIG. 5 is a cross-sectional view of a single subpixel of an organic EL display, an example of an FPD, including the above-described TFT, according to an embodiment of the invention. Each subpixel includes an organic light emitting device (OLED) as a self-luminescent element, one or more TFTs, and one or more capacitors.

The organic EL display includes various pixel patterns corresponding to the emission color of the OLED. Preferably, red (R), green (G), and blue (B) pixels are included in the organic EL display. The pixel patterns may be arranged in various patterns, such as a stripe type, a mosaic (zigzag) type, a deita type, or the like, and the pixel patterns may have various arrangements.

As discussed above, each of the R, G, and B subpixels may include an OLED as a self-luminescent element and the TFT described in detail above. However, it is understood that the TFT of the present invention is not limited to the above-description, but may have various is structures as long as the TFT includes oxidation portions formed at marginal portions or regions of source and drain electrodes, which contact an organic semiconductor layer.

Referring to FIG. 5, a gate electrode 220 is formed on or directly on a surface of a substrate 210, and a buffer layer 211 may be selectively provided therebetween. The substrate 210 may be formed of a glass-like material or a highly flexible plastic material and may be formed with various structures. A gate insulating layer 230 is formed on the substrate 210 to cover the gate electrode 220.

A source electrode 240a and a drain electrode 240b are formed on one surface of the gate insulating layer 230, and an organic semiconductor layer 250 is formed thereon. The organic semiconductor layer 250 includes a source region 250a and a drain region 250b, which correspond to the source and drain electrodes 240a and 240b, respectively, and a channel region 250c. The organic semiconductor layer 250 may be additionally formed on the gate insulating layer 230. Oxidation portions 240'a and 240'b are formed at portions or regions of the source and drain electrodes 240a and 240b that make contact with the organic semiconductor layer 250. A work function of the oxidation portions 240'a and 240'b is larger than a HOMO energy level of the organic semiconductor layer 250, which is discussed in detail above and thus is not described with reference to the embodiment show in FIG. 5 for purposes of convenience.

A protective layer 260 is formed on a surface of the organic semiconductor layer 250 as an insulating layer that protects and/or planarizes layers stacked thereunder. The protective layer 260 may comprise an organic or inorganic material and have a single layer or multiple layers. In addition, the protective layer 260 may be formed with various structures.

An OLED 300 is formed on or directly on the protective layer 260. The OLED 300 includes a first electrode layer 310, an emission portion 330, and a second electrode layer 340. The first electrode layer 310 is formed on a surface of the protective layer 260 and electrically communicates with the drain electrode 240b of the TFT provided thereunder through a via hole 261 formed in the drain region 250b of the organic semiconductor layer 250 and the protection layer 260. The via hole 261 may be formed in respective layers separately or simultaneously.

After the forming of the first electrode layer 310, a pixel defining layer 320 for defining a pixel opening 321 is formed. To form the pixel opening 321, the pixel defining layer 320 is formed on an entire surface of the resultant structure and then patterned appropriately, such that a portion of the first electrode layer 310 is exposed. For example, the patterning may be performed via photo etching or photolithography. Thereafter, an emission portion 330, including at least an emission layer, is formed on a surface of the first electrode layer 310 exposed by the pixel opening 321, and a second electrode layer 340 may then be formed on at least a surface of the emission portion 330.

The first electrode layer 310 may have various structures. For example, when the first electrode layer 310 operates as an anode and the organic EL display is a rear surface emissive display, the first electrode layer 310 may be a transparent electrode formed of a transparent conductive material, such as ITO, IZO, ZnO, $In_2O_3$ or the like. However, when the first electrode layer 310 operates as an anode and the organic EL display is a front surface emissive display, the first electrode layer 310 may be formed having a double layer of a reflective electrode formed of Ag, Mg, Al, Pt, Pd, Au, Ni, Nd, Ir, Cr, or the like, or a combination thereof, and a transparent electrode formed thereon. The first electrode layer 310 is not limited to a single or double layer, but may include multiple layers and have various other structures.

The emission portion 330 may include either a monomer or polymer organic layer. For example, a monomer organic layer may be formed by stacking at least a hole injection layer (HIL), a hole transport layer (HTL), an organic emission layer (EML), an electron transport layer (ETL), and an electron injection layer (EIL) in a simple or complex structure. Various organic materials may be used to formed the monomer organic layer, such as copper phthalocyanine (CuPc), N,N'-Di (naphthalene-1-yl)-N,N'-diphenyl-benzidine (NPB), tris-8-hydroxyquinoline aluminum (Alq3), and the like. The monomer organic layers may be formed by vacuum deposition technique.

A polymer organic layer may include at least an HTL and an EML. Here, for example, the HTL may be formed of PEDOT, and the EML may be formed of a polymer organic material, such as, for example, poly-phenylenevinylene (PPV)-containing material and polyfluorene-containing material, by a printing screen process, such as screen printing or Inkjet printing. The organic layers forming the emission portion 330 are not limited to the above described layers, but it is obvious to one of skill in the art that various changes can be made thereto.

Similar to the first electrode layer 310, the second electrode layer 340 may have various structures according to the polarity and emission type thereof. For example, when the second electrode layer 340 operators as a cathode and the organic EL display is a rear surface emissive display, the second electrode layer 340 may include one or more layers, each of the layers being formed of a material having a small work function, such as Li, Ca, LiF/Ca, LiF/Al, Al, Ag, Mg, and the like, and a combination thereof.

For example, when the second electrode layer 340 operates as a cathode and the organic EL display is a front surface emissive type, the second electrode layer 340 may include an electrode formed of a material having a small work function, such as Li, Ca, LiF/Ca, LiF/Al, Al, Ag, Mg, and the like, and a combination thereof, that is deposited or provided on a surface of the emission portion 330 and a transparent electrode formed of ITO, IZO, ZnO, $In_2O_3$, or the like, and deposited or provided thereon. Although the second electrode layer 340 may be formed on the entire surface of the resultant structure, it may be formed having various other structures. Although it is described above that the first electrode layer 310 operates as an anode and the second electrode layer 340 operates as a cathode, it is understood that he first electrode layer 310 may operate as a cathode and the second electrode layer 340 may operate as an anode, and that each of the layers may be formed having various structures.

Further, although not shown in the drawings or described above, a display region, which is formed on the substrate 210 and includes TFTs and subpixels, may be sealed by a sealing member. Specifically, a sealing substrate may be provided on the second electrode layer 340 such that the display region including at least the subpixels is sealed. Alternatively, a thin-film sealing layer having one or more layers may be formed on a surface of the second electrode layer 340. The sealing structure is not limited to the above description and various other structures may be used.

The present invention is not limited to the embodiments discussed above, for example, the embodiment may be changed so long as a TFT includes source and drain electrodes with oxidation portions that contact an organic semiconductor layer. The foregoing TFT can be applied to not only FPDs, such as organic EL displays or LCDs, but also driving circuits that do not create images, and can be variously changed.

According to the present invention as described above, the following are some of the effects that may be realized.

Adhesion between source and drain electrodes and a lower stack portion of a TFT is reinforced or strengthened. Also, the source and drain electrodes of the TFT include oxidation portions that contact at least an organic semiconductor layer and thus, electrical communications between the source and drain electrodes is more efficient through the organic semiconductor layer.

Further, the source and drain electrodes discussed above may be formed of low-cost materials instead of noble metals.

Further, signals can be efficiently processed in a circuit portion such as a driver, of the FPD and electric signals may be properly transmitted to pixels (subpixels), thereby preventing degradation of brightness of the display device. As a result, the FPD retains an excellent screen quality and reduces power dissipation.

Further, the source and drain electrodes having the oxidation portions are generally black-colored to absorb light so that optical reflection is prevented and visibility is improved in a FPD including the TFT.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor comprising:
   a substrate;
   a gate electrode provided on the substrate;
   a source electrode and a drain electrode provided on the substrate;
   a gate insulating layer provided between the gate electrode and the source electrode and the drain electrode; and
   an organic semiconductor layer contacting the source electrode and the drain electrode and insulated from the gate electrode,
   wherein oxidation portions are provided in contact portions of the source electrode and the drain electrode that directly contact organic semiconductor layer, the oxidation portions being an oxide of a metal comprising the source electrode and the drain electrode, and
   wherein the metal is at least one of Al, Mo, and MoW.

2. The thin film transistor of claim 1, wherein the gate insulating layer comprises at least one layer formed of $SiO_2$, $SiN_x$, $Al_2O_3$, $Ta_2O_5$, BST, PZT, poly methylmethacrylate, polystyrene, phenolic polymers, acrylic polymers, imidic polymers such as polyimide, aryl ether polymers, amidic polymers, fluoric polymers, p-xylilen polymers, vinyl alcoholic polymers, s parylene, or any derivative or combination thereof.

3. The thin film transistor of claim 1, wherein the organic semiconductor layer is formed of at least one of pentacene, tetracene, anthracene, naphthalene, alpha-6-thiophene, and any of the following or their derivatives: perylene, rubrene, coronene, perylene tetracarboxylic diimide, perylene tetracarboxylic dianhydride, polythiophene, polyparaphenylenvinylene, polyparaphenylen, polyflorene, polythiophenevinylene, polythiophene-heterocyclic aromatic copolymer, oligoacene of naphthalene, oligothiophene of alpha-5-thiophene, metal-containing or metal-free phthalocyanin, pyromelitic dianhydride, pyromelitic diimide, perylenetetracarboxylic acid dianhydride, perylenetetracarboxylic diimide, naphthalene tetracarboxylic acid diimide, and naphthalene tetracarboxylic acid dianhydride.

4. The thin film transistor of claim 1, wherein the oxidation portions are formed of a material having a work function that is greater than a HOMO energy level of the organic semiconductor layer.

5. A flat panel display comprising a thin film transistor layer and a pixel layer having at least one pixel and formed in a display region of a substrate, wherein the thin film transistor layer comprises:
   a gate electrode provided on the substrate;
   a gate insulating layer provided on the gate electrode;
   a source electrode and a drain electrode provided on the gate insulating layer and insulated from the gate electrode; and
   an organic semiconductor layer contacting the source electrode and the drain electrode and insulated from the gate electrode,
   wherein oxidation portions are provided in contact portions of the source and drain electrodes that directly contact the organic semiconductor layer, the oxidation portions being an oxide of a metal comprising the source electrode and the drain electrode, and
   wherein the metal is at least one of Al, Mo, and MoW.

6. The flat panel display of claim 5, wherein the oxidation portions are formed of a material having a work function that is greater than a HOMO energy level of the organic semiconductor layer.

* * * * *